United States Patent
Cohn et al.

(10) Patent No.: US 8,601,683 B2
(45) Date of Patent: Dec. 10, 2013

(54) METHOD FOR ELECTRICAL INTERCONNECTION BETWEEN PRINTED WIRING BOARD LAYERS USING THROUGH HOLES WITH SOLID CORE CONDUCTIVE MATERIAL

(75) Inventors: Charles Cohn, Wayne, NJ (US); Jeffrey M Klemovage, Whitehall, PA (US)

(73) Assignee: Agere Systems LLC, Wilmington, DE (US)

( * ) Notice: Subject to any disclaimer, the term of this patent is extended or adjusted under 35 U.S.C. 154(b) by 1802 days.

(21) Appl. No.: 11/379,256

(22) Filed: Apr. 19, 2006

(65) Prior Publication Data

US 2006/0175081 A1  Aug. 10, 2006

Related U.S. Application Data

(62) Division of application No. 10/755,616, filed on Jan. 12, 2004, now abandoned.

(51) Int. Cl.
*H05K 3/02* (2006.01)
*H05K 3/10* (2006.01)

(52) U.S. Cl.
USPC ............. 29/846; 29/829; 228/180.5; 228/254

(58) Field of Classification Search
USPC .................. 29/846, 829, 845, 847, 857, 45; 174/250, 255, 262, 265; 361/736, 760; 228/13, 180.5, 254
See application file for complete search history.

(56) References Cited

U.S. PATENT DOCUMENTS

| | | |
|---|---|---|
| 3,371,249 A | 2/1968 | Prohofsicy |
| 3,516,156 A | 6/1970 | Steranko |
| 3,772,774 A | 11/1973 | Knippenberg et al. |
| 5,185,502 A | 2/1993 | Shepherd et al. |
| 5,613,033 A | 3/1997 | Swamy et al. |
| 6,379,781 B1 | 4/2002 | Suzuki et al. |
| 6,512,187 B2 | 1/2003 | Sumida et al. |
| 6,518,571 B2 | 2/2003 | Talbot et al. |
| 6,593,535 B2 | 7/2003 | Gailus |
| 6,623,844 B2 | 9/2003 | Nishimoto |
| 6,630,630 B1 | 10/2003 | Maezawa et al. |
| 6,705,006 B2 | 3/2004 | Baechtle et al. |
| 6,712,261 B2* | 3/2004 | Hall et al. .................. 228/180.5 |
| 6,944,945 B1 | 9/2005 | Shipley et al. |
| 7,214,228 B2* | 5/2007 | Crabtree ........................ 606/108 |
| 2002/0112883 A1 | 8/2002 | Baechtle et al. |

OTHER PUBLICATIONS

U.S. Appl. No. 10/755,616, filed Jan. 12. 2004, currently pending, to Charles Cohn, et al., entitled "A Method for Electrical Interconnection Between Printed Wiring Board Layers Using Through Holes With Solid Core Conductive Material".

* cited by examiner

*Primary Examiner* — Thiem Phan

(57) ABSTRACT

The present invention provides method of manufacture for a printed wiring board. The printed wiring board constructed according to the teachings of the present invention includes a printed wiring board dielectric layer having conductive foils located on at least two sides thereof. The printed wiring board further includes a solid core conductive material interconnecting the conductive foils.

9 Claims, 10 Drawing Sheets

METHOD FOR ELECTRICAL INTERCONNECTION BETWEEN PRINTED WIRING BOARD LAYERS USING THROUGH HOLES WITH SOLID CORE CONDUCTIVE MATERIAL

This Application is a Divisional of prior application Ser. No. 10/755,616 filed on Jan. 12, 2004, currently abandoned, to Charles Cohn, et al. The above-listed Application is commonly assigned with the present invention and is incorporated herein by reference as if reproduced herein in its entirety under Rule 1.53(b)

TECHNICAL FIELD OF THE INVENTION

The present invention is directed, in general, to a printed wiring board and, more specifically, to a printed wiring board including a solid core conductive material and a method of manufacture therefor.

BACKGROUND OF THE INVENTION

Printed wiring boards (PWBs) are an integral part of electronic equipment and there have been continuing efforts to increase the interconnection density and electrical efficiency of PWBs and thus decrease their size and cost. The technology relating to PWBs goes back a number of years and, in general, a printed circuit is patterned on a copper foil which is located on the surface of a dielectric material such as a plastic substrate. These boards vary in design and may have a copper foil on each surface of the plastic substrate, usually epoxy, (termed 2-sided boards) or they can be multi-layer boards which have a plurality of interleaved parallel planar copper foils and epoxy layers. In both types, through-holes are drilled in the board and metal plated to facilitate connection between the copper foil circuits.

Unfortunately, the copper plated through holes used in these conventional structures are susceptible to barrel cracking during qualification testing, e.g., thermal cycling. The barrel cracking, as those skilled in the art are aware, negatively affects the electrical characteristics of the PWB. The industry has contemplated drilling a small enough through hole in the PWB that the copper plating would fill and thereby prevent the barrel cracking. Unfortunately, the through holes have typically high aspect ratios, and the filling of the holes with copper using the plating technique would undeniably block one end of the hole, thus trapping unwanted matter therein. Again, the electrical characteristics of the PWB would be compromised. Additionally, during plating of the through holes copper is also deposited on the flat external surfaces of the PWB, resulting in thicker copper layers. These thicker copper layers tend to impede subtractive fine line patterning.

Accordingly, what is needed in the art is an electrical connection between PWB layers that does not experience the problems or drawbacks experienced or introduced by the prior art electrical connections.

SUMMARY OF THE INVENTION

To address the above-discussed deficiencies of the prior art, the present invention provides a printed wiring board and a method of manufacture therefor. The printed wiring board constructed according to the teachings of the present invention includes a printed wiring board dielectric layer having conductive foils located on at least two sides thereof. The printed wiring board further includes a solid core conductive material located in the printed wiring board dielectric layer and interconnecting the conductive foils.

As indicated above, the present invention further provides a method for manufacturing the aforementioned printed wiring board. Among other elements, the method for manufacturing the printed wiring board includes providing a printed wiring board dielectric layer having conductive foils located on at least two sides thereof, and inserting a solid core conductive material within the printed wiring board dielectric layer, thereby interconnecting the conductive foils.

Additionally, the present invention provides an electronic subassembly including the aforementioned printed wiring board. The electronic subassembly, among other elements, includes: 1) a printed wiring board, including a printed wiring board dielectric layer having conductive foils located on at least two sides thereof and a solid core conductive material located in the printed wiring board dielectric layer and interconnecting the conductive foils, and 2) electronic components located on one or more surfaces of the printed wiring board.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
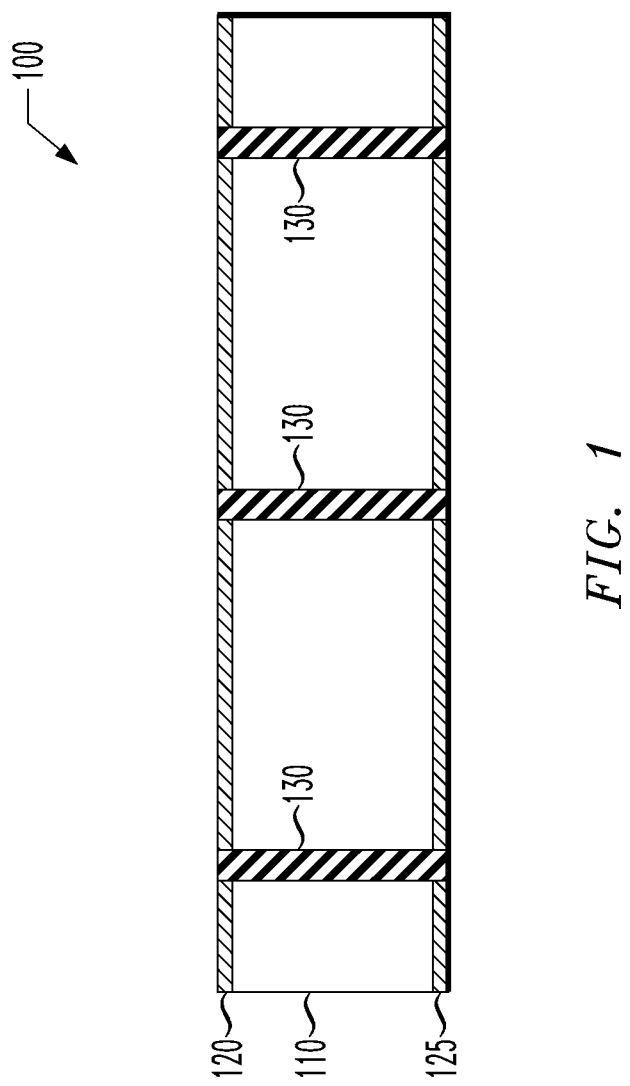
FIG. 1 illustrates a cross-sectional view of one embodiment of a printed wiring board (PWB) constructed in accordance with the principles of the present invention.

Referring initially to FIG. 1, illustrated is a cross-sectional view of one embodiment of a printed wiring board (PWB) 100 constructed in accordance with the principles of the present invention. The PWB 100 illustrated in FIG. 1 includes, as is standard, a printed wiring board dielectric layer 110 having conductive foils 120, 125, located on at least two sides thereof. In the particular embodiment shown in FIG. 1, the conductive foils 120, 125, happen to be located on opposing sides of the dielectric layer 110.

The dielectric layer 110 may comprise a multitude of different materials while staying within the scope of the present invention. Similarly, the conductive foils 120, 125, may include a number of different materials. For example, while the present invention will be discussed throughout as having copper conductive foils, those skilled in the art understand that almost any known or hereafter discovered conductive foil could be used for the conductive foils 120, 125.

Located within the dielectric layer 110 in the embodiment shown and discussed with respect to FIG. 1 is a solid core conductive material 130. The solid core conductive material 130, or in this embodiment the three solid core conductive materials 130, interconnect the conductive foils 120, 125. Particularly, the solid core conductive material 130 electrically connects the conductive foils 120, 125.

In the particular embodiment of FIG. 1, the solid core conductive material 130 comprises a solid core wire that has been inserted into the dielectric layer 110. For example, a solid core copper wire or another conductive wire could be used. As the solid core conductive material 130 is solid, as compared to the conventional hollow plated through holes, the solid core conductive material 130 may have a smaller diameter than the conventional hollow plated through holes while providing the same current carrying capacity. For example, in an exemplary embodiment the solid core conductive material 130 may have a diameter that ranges from about 0.050 mm to about 0.200 mm, and preferably a diameter that ranges from about 0.100 mm to about 0.150 mm, while providing the desired current carrying capacity required for the PWB 100 to operate properly. In support of this, it is believed that a 0.150 mm diameter solid core copper conductive material 130 has the equivalent current carrying capacity as a 0.375 mm diameter by 0.015 mm thick copper plated through hole.

Accordingly, the advantages of using the solid core conductive material 130 rather than the prior art hollow plated through holes, are abundant. First, no metal plating of the through holes or epoxy filling of the plated through holes is required. Both these steps are costly and time consuming processes. Additionally, the solid core conductive material 130 does not experience the barrel cracking issues experienced by the prior art plated through holes. Likewise, as no panel plating is required to plate the through holes, the conductive foil thickness may be thinner. As those skilled in the art are aware, the thinner conductive foils make finer pattern design rules possible.

In addition to those benefits disclosed in the paragraph above, better packing density can be achieved as the diameter of the solid core conductive material 130 is smaller than the plated through holes for the same current carrying values. Additionally, the solid core conductive material 130 provides improved thermal dissipation due to the solid metal cross-section.

Figure 2:
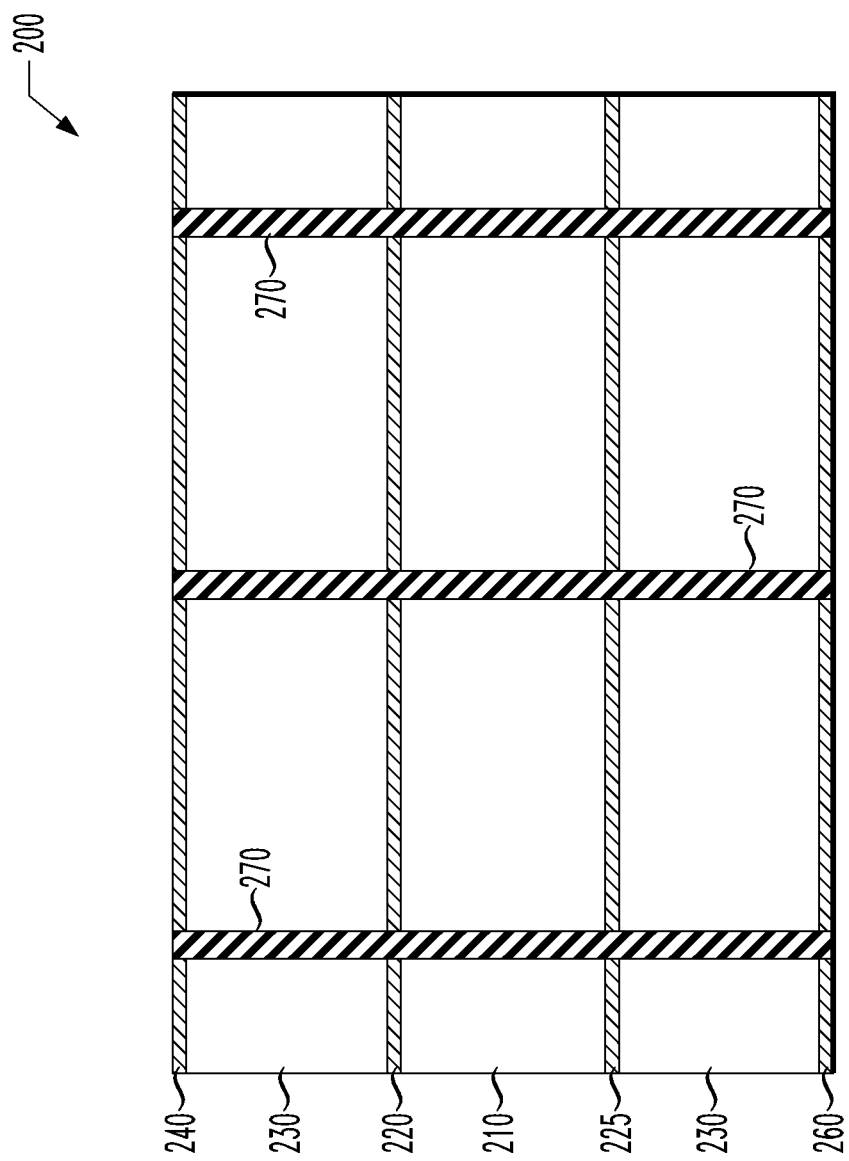
FIG. 2 illustrates a cross-sectional view of an alternative embodiment of a PWB that has been constructed in accordance with the principles of the present invention.

Turning briefly to FIG. 2, illustrated is a cross-sectional view of an alternative embodiment of a PWB 200 that has been constructed in accordance with the principles of the present invention. The PWB 200 illustrated in FIG. 2 is similar to the PWB 100 illustrated in FIG. 1, with the exception that it includes additional dielectric substrates and conductive foils, thus, representing a multilayer PWB. For example, the PWB 200 of FIG. 2 includes a first dielectric layer 210 having first and second conductive foils 220, 225, located on opposing sides thereof. The PWB 200 further includes a second dielectric layer 230 and a third conductive foil 240 contacting the first conductive foil 220, as well as a third dielectric layer 250 and fourth conductive foil 260 contacting the second conductive foil 225. In the embodiment of FIG. 2, solid core conductive material 270 interconnects the first, second, third and fourth conductive foils 220, 225, 240, 260, respectively.

Figure 3:
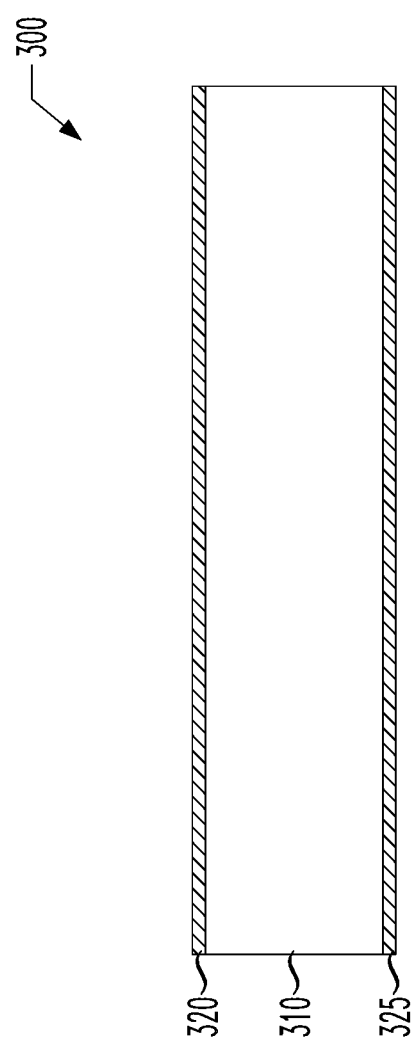
FIG. 3 illustrates a cross-sectional view of a partially completed PWB at an initial stage of manufacture.

Turning now briefly to each of FIGS. 3-9, illustrated are cross-sectional views of detailed manufacturing steps instructing how one might, in an advantageous embodiment, manufacture a PWB similar to the PWB 100 depicted in FIG. 1. FIG. 3 illustrates a cross-sectional view of a partially completed PWB 300 at an initial stage of manufacture. The PWB 300 illustrated in FIG. 3 includes a conventional printed wiring board dielectric layer 310 having first and second conductive foils 320, 325, located on opposing sides thereof. The conventional dielectric layer 310 may comprise many materials, however, an organic dielectric layer has been observed to work well. Likewise, the conventional dielectric layer 310 may have varying thicknesses, including conventional thicknesses ranging from about 0.060 mm to about 0.800 mm.

Similarly, the first and second conductive foils 320, 325, may comprise many materials. While copper may be the most common conductive foil used, those skilled in the art understand that other materials, such as aluminum, could just as easily be used. The first and second conductive foils 320, 325, among others, may have thicknesses ranging from about 0.005 mm to about 0.075 mm. As the process for forming the first and second conductive foils 320, 325, on the dielectric layer 310 is conventional, no details are required.

Figure 4:
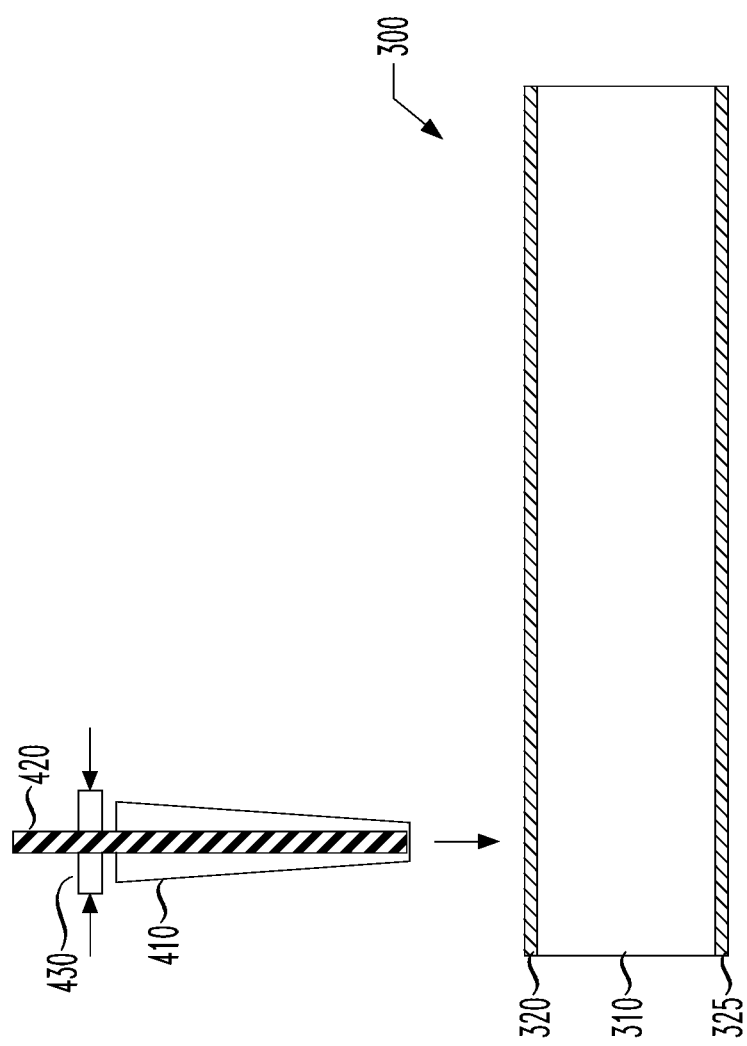
FIG. 4 illustrates a cross-sectional view of the partially completed PWB illustrated in FIG. 3 as an insertion means approaches the first conductive foil.

Turning now to FIG. 4, illustrated is a cross-sectional view of the partially completed PWB 300 illustrated in FIG. 3 as an insertion means 410 approaches the first conductive foil 320. The insertion means 410, which may be a sharp hollow object such as a needle, has a solid core conductive material 420 located therein. At this point in the manufacturing process it may be advantageous to increase the temperature of the PWB 300 to allow the insertion means 410 to penetrate there through easier. It is believed that a temperature ranging from about 50° C. to a temperature of less than about a glass transition temperature of the dielectric layer 310, is optimal. Other temperatures are, however, within the scope of the present invention.

As is illustrated in FIG. 4, a control means 430, such as a chuck, may be used to control a feed of the solid core conductive material 420. For example, depending on the position of the solid core conductive material 420, and the stage of manufacture of the partially completed PWB 300, the control means 430 may be in a closed position, in an open position, moving toward the tip of the insertion means 410, moving away from the tip of the insertion means 410, or any combination thereof. In the illustrative embodiment of FIG. 4, the control means 430 is holding the solid core conductive material 420 in a fixed position relative to the insertion means 410.

Figure 5:
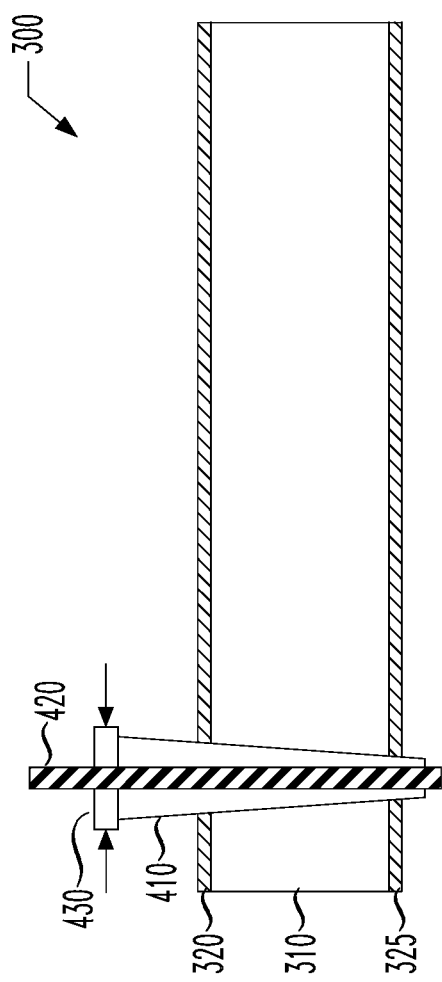
FIG. 5 illustrates a cross-sectional view of the partially completed PWB illustrated in FIG. 4 as the insertion means penetrates the first conductive foil, dielectric layer and second conductive foil.

Turning now to FIG. 5, illustrated is a cross-sectional view of the partially completed PWB 300 illustrated in FIG. 4 as the insertion means 410 penetrates the first conductive foil 320, dielectric layer 310 and second conductive foil 325. The insertion means 410 should penetrate far enough into the second conductive foil 325 that the solid core conductive material 420 is capable of electrically connecting the first and second conductive foils 320, 325. As such, as shown in FIG. 5, it is optimal to insert the insertion means 410 entirely through the second conductive foil 325. In the embodiment shown in FIG. 5, the solid core conductive material 420 extends a distance past the surface of the second conductive foil 325. As is illustrated in FIG. 5, the control means 430 helps position the solid core conductive material 420 to extend past the surface of the second conductive foil 325.

Figure 6:
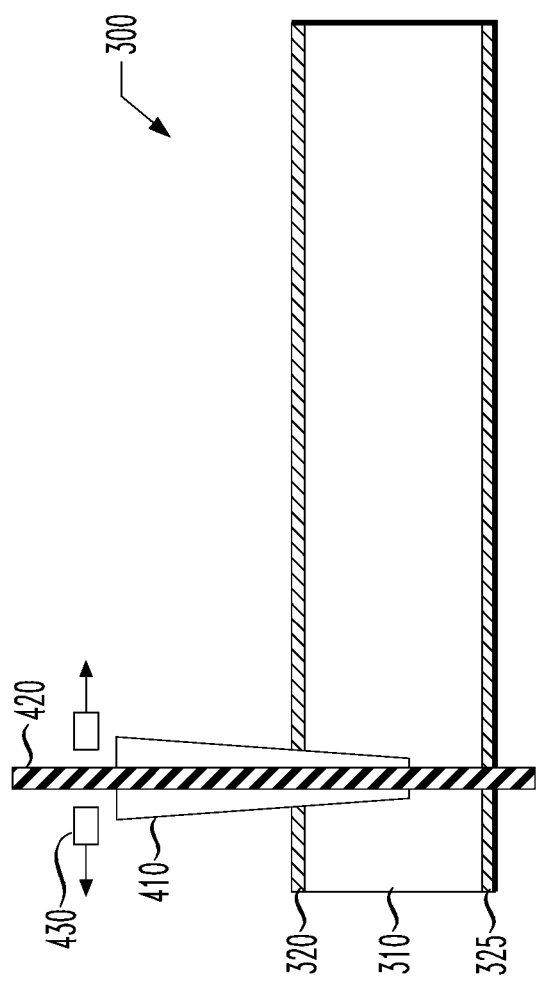
FIG. 6 illustrates a cross-sectional view of the partially completed PWB illustrated in FIG. 5 as the insertion means is being removed from the second conductive foil, dielectric layer and first conductive foil.

Turning now to FIG. 6, illustrated is a cross-sectional view of the partially completed PWB 300 illustrated in FIG. 5 as the insertion means 410 is being removed from the second conductive foil 325, dielectric layer 310 and first conductive foil 320. The insertion means 410 should be removed in such a fashion as to cause the solid core conductive material 420 to remain within the second conductive foil 325, dielectric layer 310 and first conductive foil 320. While this may be accomplished in one of many ways, it is believed that as the insertion means 410 is retracted from the PWB 300, the solid core conductive material 420 is held in place by the slightly shrinking hole formed by the insertion means 410.

Figure 7:
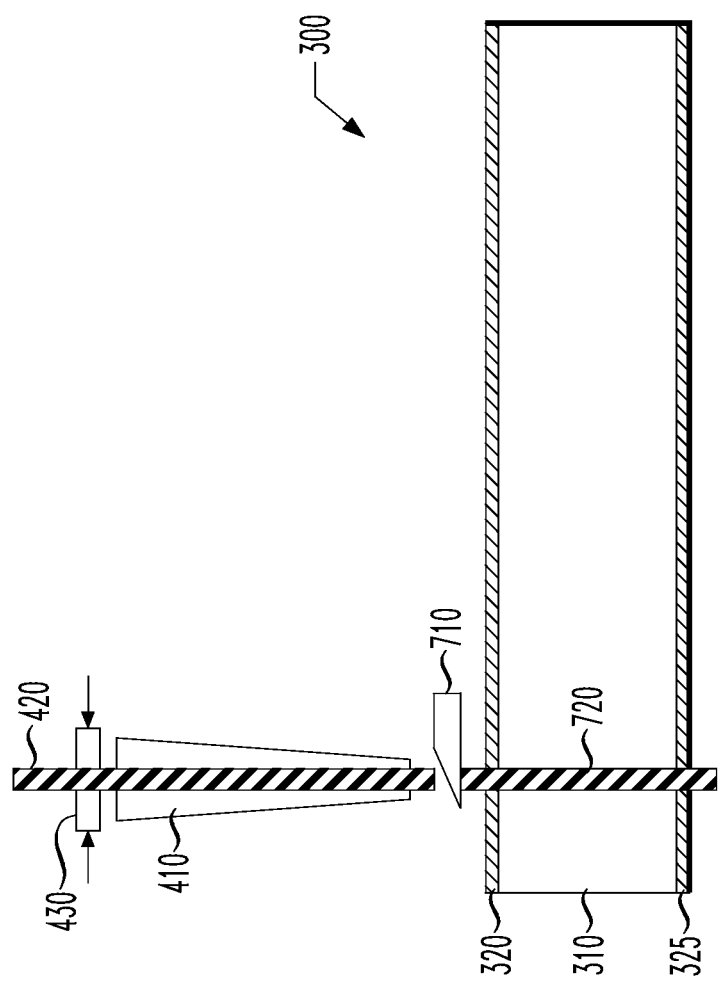
FIG. 7 illustrates a cross-sectional view of the partially completed PWB illustrated in FIG. 6 as the insertion means is completely removed from the PWB and a cutting tool severs the solid core conductive material, thereby forming the solid core conductive material.

Turning now to FIG. 7, illustrated is a cross-sectional view of the partially completed PWB 300 illustrated in FIG. 6 as the insertion means 410 is completely removed from the PWB 300 and a cutting tool 710 severs the solid core conductive material 420, thereby forming the solid core conductive material 720. The cutting tool 710, which may be any kind of object capable of separating the solid core conductive material 720 from the solid core conductive material 420, desirably leaves a small portion of the solid core conductive material 720 above the surface of the first conductive foil 320. This small portion confirms that the solid core conductive material 720 extends entirely through the second conductive foil 325, dielectric layer 310 and first conductive foil 320, and establishes that the second conductive foil 325 and first conductive foil 320 are electrically interconnected with one another.

Figure 8:
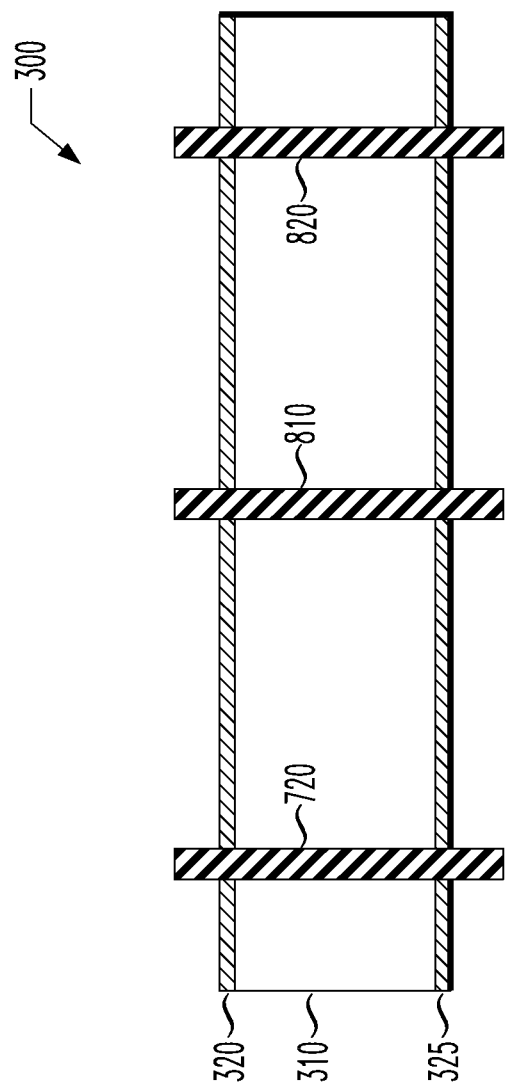
FIG. 8 illustrates a cross-sectional view of the partially completed PWB illustrated in FIG. 7 after additional solid core conductive material portions are inserted in the dielectric layer.

Turning now to FIG. 8, illustrated is a cross-sectional view of the partially completed PWB 300 illustrated in FIG. 7 after additional solid core conductive material portions 810, 820, are inserted in the dielectric layer 310. The additional solid core conductive material portions 810, 820, have been formed in a similar manner as the solid core conductive material 720.

Figure 9:
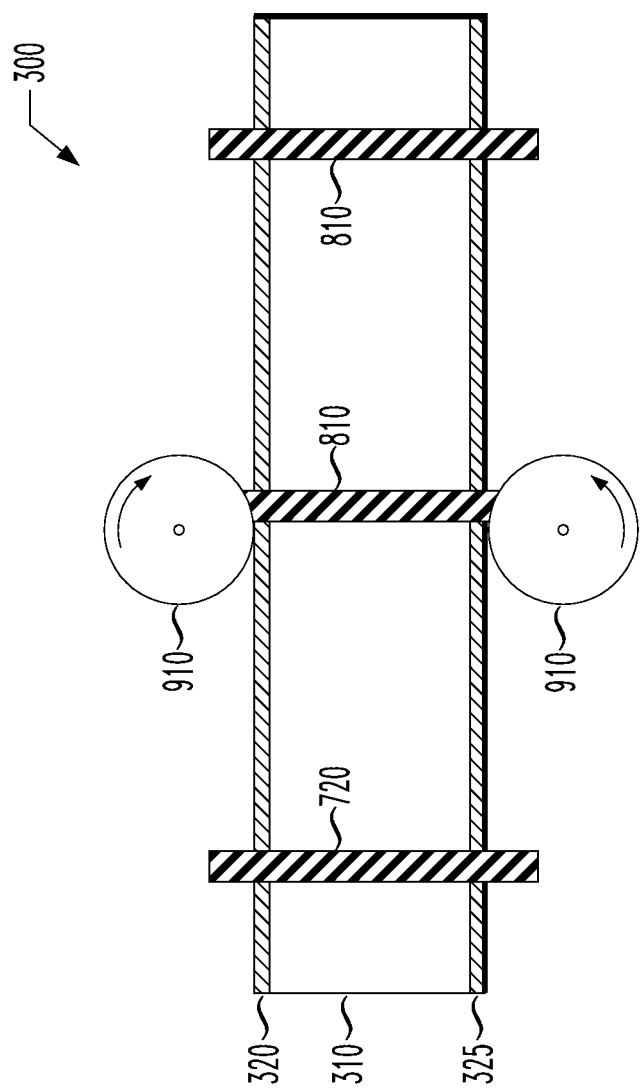
FIG. 9 illustrates a cross-sectional view of the partially completed PWB illustrated in FIG. 8 after a scrubbing means removes excess solid core conductive material extending from the first and second conductive foils.

Turning now to FIG. 9, illustrated is a cross-sectional view of the partially completed PWB 300 illustrated in FIG. 8 after a scrubbing means 910 removes excess solid core conductive material extending from the first and second conductive foils 320, 325. The scrubbing means 910 may be any known or hereafter discovered scrubbing means capable of removing the excess solid core conductive material. In addition to removing the excess solid core conductive material, the scrubbing means 910 advantageously smooths the surface of the first and second conductive foils 320, 325. After removing the excess solid core conductive material extending from the first and second conductive foils 320, 325, the manufacturing process would continue by patterning certain portions of the first and second conductive foils 320, 325.

Figure 10:
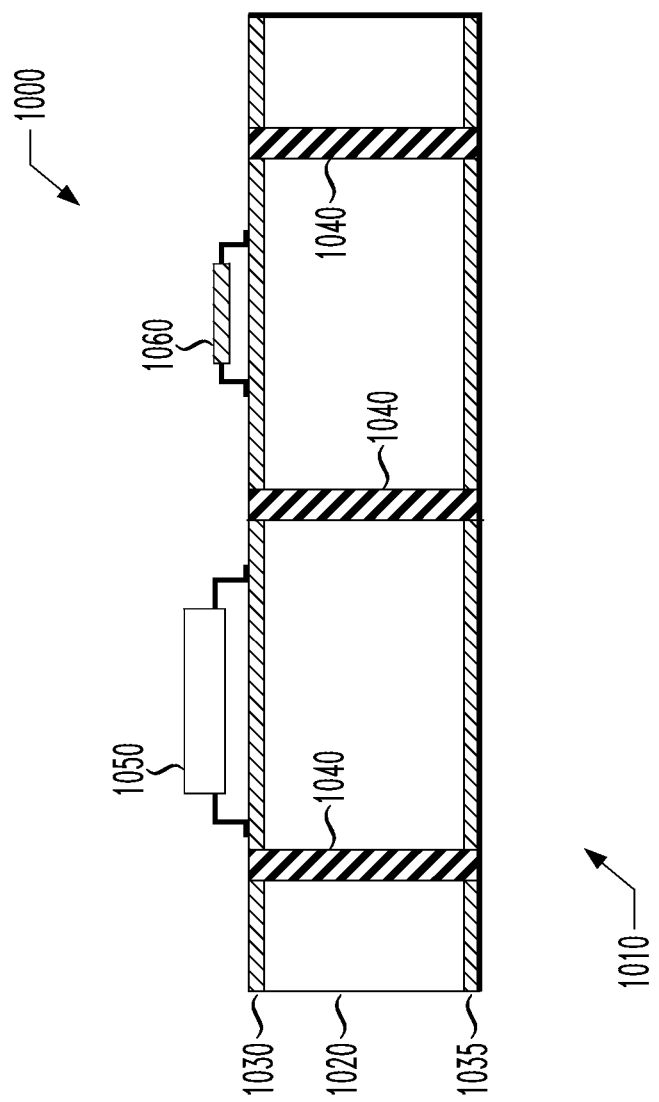
FIG. 10 illustrates a cross-sectional view of an electronic subassembly incorporating a PWB constructed according to the principles of the present invention.

Turning briefly to FIG. 10, illustrated is a cross-sectional view of an electronic subassembly 1000 incorporating a PWB constructed according to the principles of the present invention. The electronic subassembly 1000 includes a PWB 1010 somewhat similar to the PWB 100 shown and discussed with respect to FIG. 1. For example, the PWB 1010 includes a dielectric layer 1020 having first and second conductive foils 1030, 1035, located on opposing sides thereof. The PWB further includes three solid core conductive material portions 1040 interconnecting the first and second conductive foils 1030, 1035. The electronic subassembly 1000 further includes electronic components 1050, 1060, located on one or more surfaces of the PWB 1010. In the particular embodiment illustrated in FIG. 10, the electronic components 1050, 1060, are an integrated circuit and resistor, respectively, and are located on the first conductive foil 1030. While the electronic components have been illustrated as an integrated circuit and a resistor in the embodiment of FIG. 10, those skilled in the art understand that other types of electronic components are within the scope of the present invention. Additionally, while only two electronic components are illustrated in the embodiment of FIG. 10 more than two electronic components will generally be used on either or both conductive foils 1030, 1035.

Although the present invention has been described in detail, those skilled in the art should understand that they can make various changes, substitutions and alterations herein without departing from the spirit and scope of the invention in its broadest form.

What is claimed is:

1. A method for manufacturing a printed wiring board, comprising:
    providing a printed wiring board dielectric layer having conductive foils located on at least two sides thereof;
    inserting a solid core conductive material within said printed wiring board dielectric layer, including:
        inserting a sharp hollow object containing said solid core conductive material therein within said printed wiring board dielectric; and
        removing said sharp hollow object from said printed wiring board dielectric leaving said solid core conductive material therein thereby interconnecting said conductive foils.

2. The method as recited in claim 1 wherein inserting a solid core conductive material within said printed wiring board dielectric layer includes inserting a solid core wire within said printed wiring board dielectric layer.

3. The method as recited in claim 2 wherein inserting a solid core wire within said printed wiring board dielectric layer includes inserting a solid core copper wire within said printed wiring board dielectric layer.

4. The method as recited in claim 1 wherein said solid core conductive material has a diameter ranging from about 0.050 mm to about 0.200 mm.

5. The method as recited in claim 4 wherein said solid core conductive material has a diameter ranging from about 0.100 mm to about 0.150 mm.

6. The method as recited in claim 1 wherein inserting a solid core conductive material within said printed wiring board dielectric layer using a sharp hollow object includes inserting a solid core conductive material within said printed wiring board dielectric layer using a needle.

7. The method as recited in claim 1 further including increasing a temperature of said printed wiring board dielectric substrate prior to inserting said solid core conductive material within said printed wiring board dielectric layer.

8. The method as recited in claim 7 wherein said temperature ranges from about 50° C. to a temperature less than a glass transition temperature of said printed wiring board dielectric layer.

9. The method as recited in claim 1 wherein said printed wiring board dielectric layer is a first dielectric layer and first and second conductive foils are located on opposing sides thereof, and further including forming a second dielectric layer and third conductive foil contacting said first conductive foil and a third dielectric layer and a fourth conductive foil contacting said second conductive foil, wherein said solid core conductive material interconnects said first, second, third and fourth conductive foils.

* * * * *